(12) United States Patent
Yang et al.

(10) Patent No.: US 9,299,662 B2
(45) Date of Patent: Mar. 29, 2016

(54) SEMICONDUCTOR DEVICE AND DISPLAY DEVICE HAVING ALIGNMENT MARK

(71) Applicant: Fitipower Integrated Technology, Inc., Hsinchu (TW)

(72) Inventors: Chun-Ping Yang, Hsinchu (TW); Da-Pong Zhang, Hsinchu (TW)

(73) Assignee: Fitipower Integrated Technology, Inc., Hsinchu (TW)

( * ) Notice: Subject to any disclaimer, the term of this patent is extended or adjusted under 35 U.S.C. 154(b) by 150 days.

(21) Appl. No.: 13/954,930

(22) Filed: Jul. 30, 2013

(65) Prior Publication Data

US 2014/0035171 A1 Feb. 6, 2014

(30) Foreign Application Priority Data

Aug. 1, 2012 (TW) .............................. 101127669 A (51) Int. Cl.
*H01L 23/544* (2006.01)

(52) U.S. Cl.
CPC ....... *H01L 23/544* (2013.01); *H01L 2223/5442* (2013.01); *H01L 2223/54426* (2013.01); *H01L 2223/54473* (2013.01); *H01L 2924/0002* (2013.01)

(58) Field of Classification Search
CPC .................. H01L 23/544; H01L 2021/60075; H01L 2223/54426; H01L 2224/0213; H01L 2224/0217; H01L 2224/0224; H01L 2224/10135; H01L 2224/10165; H01L 2224/26135; H01L 2224/80121; H01L 2224/83121; H01L 2224/84121; H01L 2224/85121; H01L 2224/86121; H01L 2224/86122; H01L 2225/16593
See application file for complete search history.

(56) References Cited

U.S. PATENT DOCUMENTS

| 6,211,935 | B1 * | 4/2001 | Yamada ........................ 349/149 |
| 6,938,335 | B2 * | 9/2005 | Kuribayashi et al. ........... 29/834 |
| 2003/0155908 | A1 * | 8/2003 | Ohazama ................... 324/158.1 |
| 2008/0121915 | A1 * | 5/2008 | Horii .............................. 257/98 |
| 2009/0206411 | A1 * | 8/2009 | Koketsu et al. ............... 257/368 |

* cited by examiner

*Primary Examiner* — Peniel M Gumedzoe
(74) *Attorney, Agent, or Firm* — Novak Druce Connolly Bove + Quigg LLP (57) ABSTRACT

An exemplary display device includes a transparent substrate and a semiconductor device bonded to the transparent substrate. The transparent substrate includes a first alignment mark. The semiconductor device includes a substrate and a second alignment mark positioned on the substrate. The second alignment mark includes a first pattern structure positioned on the substrate and a second pattern structure positioned on the first pattern structure. The first pattern structure includes a plurality of first non-transparent marks. The second pattern structure includes a second pattern surrounded by the first non-transparent marks. The second pattern is an alignable shape that corresponds to a shape of the first alignment mark on the transparent substrate.

15 Claims, 11 Drawing Sheets

SEMICONDUCTOR DEVICE AND DISPLAY DEVICE HAVING ALIGNMENT MARK

BACKGROUND

1. Technical Field

The present disclosure relates to a semiconductor device and a display device, and more particularly to an alignment mark of a semiconductor device connectable to a transparent substrate in a display device employing a Chip-on-Glass (COG) method.

2. Description of Related Art

In a display device employing a Chip-on-Glass (COG) method, which is a technique for directly mounting a driving IC (IC chip) on a transparent substrate without interposing an FPC (Flexible Printed Circuit) or similar designs, where electrode terminals provided on the transparent substrate are connected to the IC chip to drive the display device. The transparent substrate is provided with electrodes, such as pixel electrodes for driving the display device, and the electrode terminals for supplying signals from the IC chip to the electrodes. Pads of the IC chip are connected to the electrode terminals through protruding electrical contacts called solder balls hereinafter, and output the signals for driving the display device to the electrodes.

An alignment mark on the IC chip may be formed by etching one of layers of the IC chip to form a pattern. The pattern may consist of two contrasting shapes including a first shape that scatters incident light from the photodetector, and a second shape that efficiently reflects the incident light in an incident direction, such that the first shape appears dark and the second shape appears light. Accordingly, the second shape is used to align with the alignment mark on the transparent substrate.

However, because the first shape and the second shape are formed by the same layer, contrast between the bright region and the dark region of the alignment mark on the IC chip is apt to be low. Accordingly, it is difficult to detect the alignment mark on the IC chip with a photodetector or naked eyes, and therefore a highly accurate alignment may be difficult to obtain.

What is needed, therefore, is to provide an item which overcomes the above-mentioned problems.

DETAILED DESCRIPTION

Reference will be made to the drawing to describe specific exemplary embodiments of the present disclosure in detail.

The present disclosure relates to clearly visible alignment marks on a semiconductor device and a display device. When the semiconductor device is bonded to a transparent substrate of the display device (shown in FIG. 1) employing a Chip-on-Glass (COG) method, the alignment marks can be accurately detected by a photodetector 90 (shown in FIG. 1), such that the semiconductor device and the display device can be accurately aligned with use of the alignment marks according to the present disclosure. Here, an IC chip 20 and a liquid crystal display 1 are described as an example of the semiconductor device and the display device, respectively.

Figure 1:
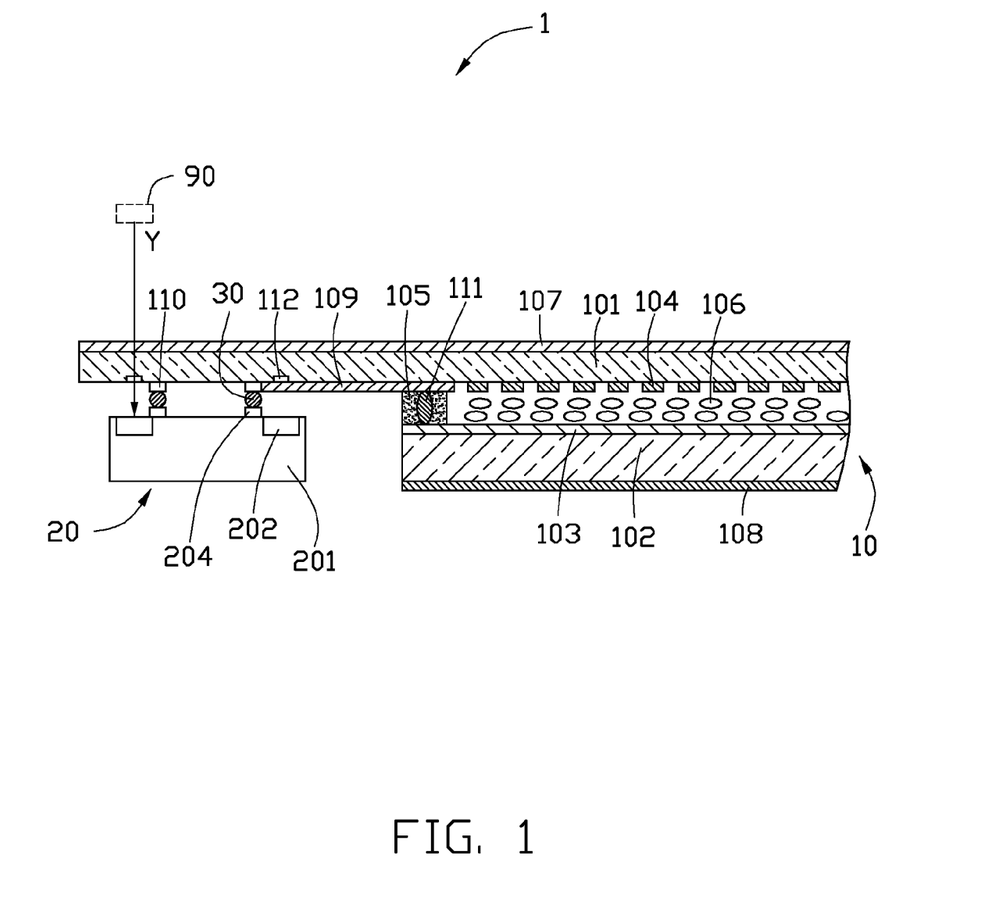
FIG. 1 is a sectional view showing a structure of a liquid crystal panel mounted with an IC chip according to the present disclosure.

FIG. 1 is a sectional view showing a structure of the liquid crystal display 1 mounted with the IC chip 20 according to the present disclosure. The liquid crystal display 1 includes a liquid crystal panel 10, the IC chip 20, and solder balls 30. The IC chip 20 is mounted on the liquid crystal panel 10 through the solder balls 30.

The liquid crystal panel 20 includes a first transparent substrate 101, a second transparent substrate 102, a common electrode 103, a plurality of pixel electrodes 104, a sealant 105, a liquid crystal layer 106, a first polarizer 107, a second polarizer 108, a plurality of metal wirings 109, and a plurality of electrode terminals 110. The first transparent substrate 101 and the second transparent substrate 102 face each other. The liquid crystal 106 is sandwiched between the first transparent substrate 101 and the second transparent substrate 102, and sealed in place using the sealant 105. The pixel electrodes 104 and the first polarizer 107 are positioned on two opposite sides of the first transparent substrate 101, and the pixel electrodes 104 are positioned on a side adjacent to the liquid crystal layer 106 of the first transparent substrate 101. The common electrode 103 and the second polarizer 108 are positioned on two opposite sides of the second transparent substrate 102, and the common electrode 103 is positioned on a side adjacent to the liquid crystal layer 106 of the second transparent substrate 102.

The metal wirings 109 and the electrode terminals 110 are positioned on the same side of the first transparent substrate 101 as the pixel electrodes 104. The electrode terminals 110 are connected to corresponding metal wirings 109. Driving signals such as data signals, common signals, or scanning signals are provided to the liquid crystal panel 10 via the metal wirings 109. The sealant 105 is doped with a plurality of conductive particles 111. The conductive particles 111 connect at least one metal wiring 109 to the common electrode 103 so that the common signals can be transmitted to the common electrode 103 via the corresponding metal wiring 109 and the conductive particles 111 in order.

The first transparent substrate 101 includes at least one alignment mark 112 positioned on the same side of the transparent substrate 101 as the electrode terminals 110. In the disclosure, the number of the at least one alignment mark 112 is two.

Figure 2:
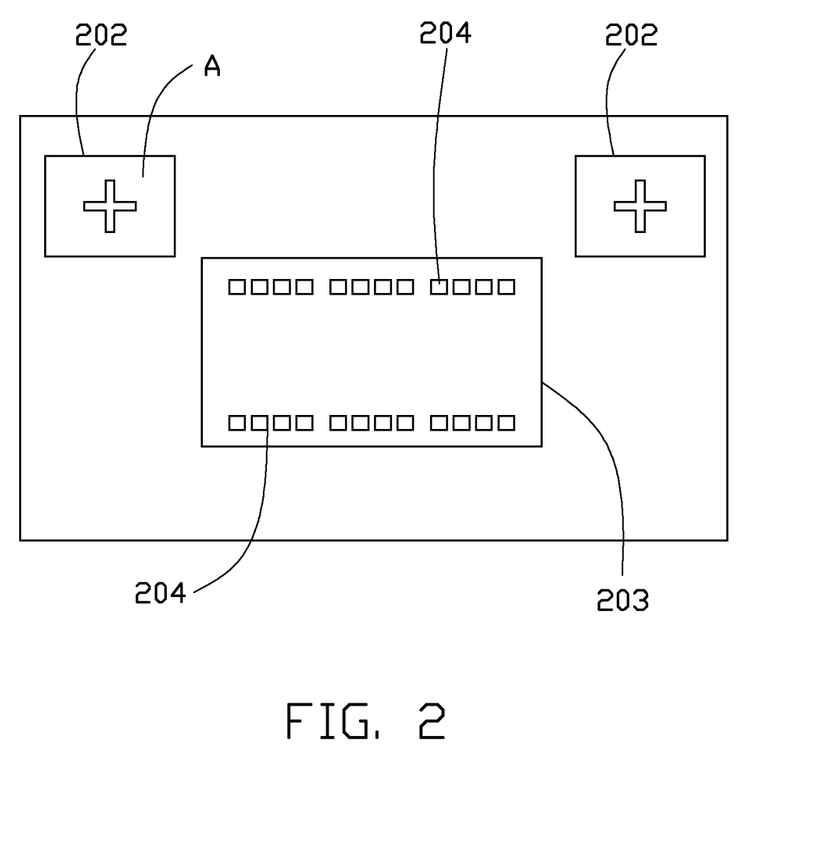
FIG. 2 is a plan view showing a structure of the IC chip according to the present disclosure, as viewed from a photodetector side, the IC chip including an alignment mark and a circuit area.

The IC chip 20 is mounted on the first transparent substrate 101 to connect with the metal wirings 110 via the solder balls 30. Referring to FIGS. 1 and 2, a structure of the IC chip 20 is described. FIG. 2 is a plan view showing the structure of the IC chip 20 according to the present disclosure, as viewed from a side of the first transparent substrate 101 to the IC chip 20. The IC chip 20 includes a semiconductor substrate 201 (shown in FIG. 1), at least one alignment mark 202 respectively corresponding to the at least one alignment mark 112 located at the first transparent substrate 101, a circuit area 203 as an integrated circuit body, and a plurality of pads 204. The at least one alignment mark 202 and the circuit area 203 are positioned on the semiconductor substrate 201. The pads 204 are connected to circuit components of the circuit area 203 and further connected to corresponding electrode terminals 110 via the solder balls 30 for transmitting or receiving signals generated by the liquid crystal panel 10 and the IC chip 20.

The at least one alignment mark 202 is formed on the same surface of the semiconductor substrate 201 as the pads 204. In the disclosure, the number of the at least one alignment mark 202 is identical with the number of the at least one alignment mark 112. Accordingly, the number of the at least one alignment mark 202 is two. Correspondingly, two predetermined areas A at a peripheral of the IC chip 20 are designated to form the two alignment marks 202. However, the number of the at least one alignment mark 202 and the number of the at least one alignment mark 112 are not limited to two respectively, but may be, one, three, four, or more, for example. The semiconductor substrate 201 may be a silicon substrate, for example. The circuit area 203 is positioned between the two alignment marks 202. The circuit area 203 includes a plurality of circuit patterns composed of the circuit components (shown in FIG. 5).

The two alignment marks 202 are detected along a Y direction by the photodetector 90, and then a position of the first transparent substrate 101 or the IC chip 20 is adjusted such that the two alignment marks 202 are aligned with the two alignment marks 112 respectively. When the two alignment marks 202 are aligned with the two alignment marks 112 respectively, the pads 204 on the IC chip 20 are bonded to the respectively corresponding electrode terminals 110 via the solder balls 30, such that the IC chip 20 is precisely mounted on the first transparent substrate 101. The driving signals from the IC chip 20 are supplied to the liquid crystal panel 10 via the pads 204, the solder balls 30, and the electrode terminals 110, in order to drive the liquid crystal panel 10 to display images.

Figure 3:
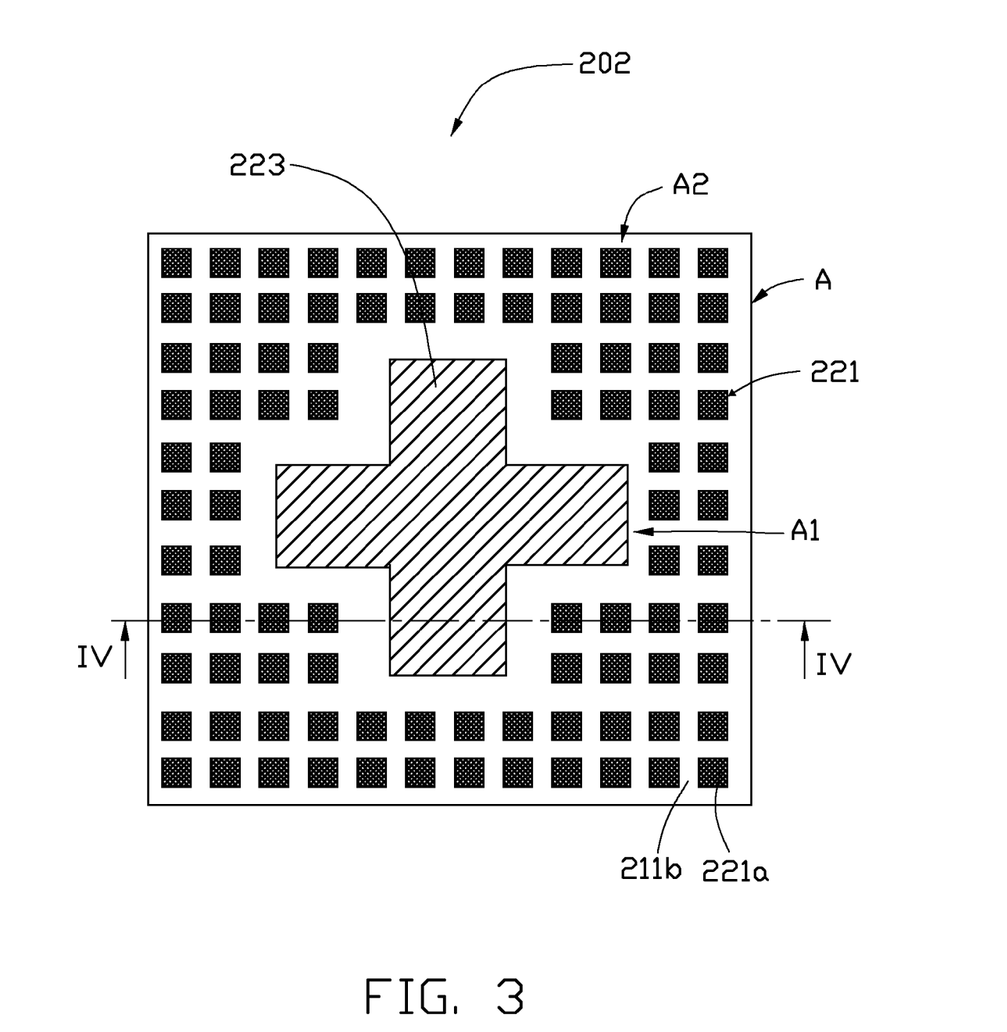
FIG. 3 is a plan view showing a structure of the alignment mark of FIG. 2 in a first embodiment according to the present disclosure, as viewed from a photodetector side.
Figure 4:
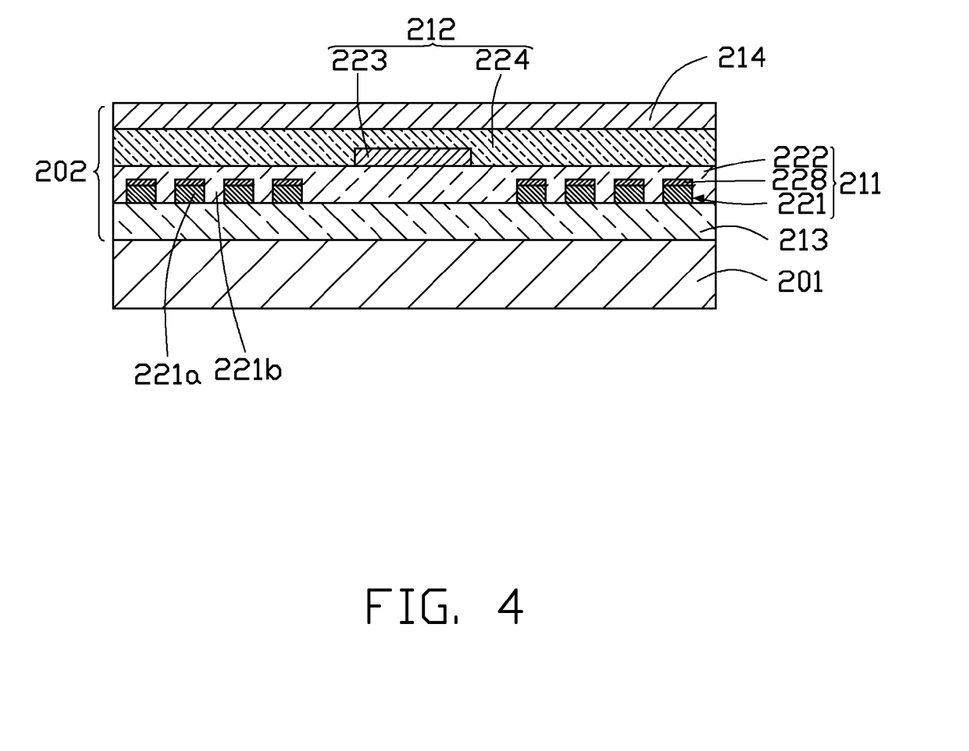
FIG. 4 is a sectional view along the line IV-IV shown in FIG. 3.

Referring to FIGS. 3 and 4, a structure of one of the alignment marks 202 in a first embodiment is described. FIG. 3 is a plan view showing the structure of the alignment mark 202 as viewed from the photodetector 90 (viewed in the Y direction). FIG. 4 is a sectional view along the line IV-IV shown in FIG. 3. The alignment mark 202 includes an interlayer insulation layer 213, a first pattern structure 211, a second pattern structure 212, and a passivation layer 214 all sequentially stacked on the semiconductor substrate 201 in order. The interlayer insulation layer 213 is sandwiched between the semiconductor substrate 201 and the first pattern structure 211. The first pattern structure 211 is sandwiched between the interlayer insulation layer 213 and the second pattern structure 212. The second pattern structure 212 is sandwiched between the first pattern structure 211 and the passivation layer 214. The interlayer insulation layer may be a SiO$_2$ layer, for example. The passivation layer 214 may comprise SiO$_2$ and SiN, for example.

The first pattern structure 211 includes a first pattern 221, a first antireflection film 228, and a first interlayer insulation film 222. The first pattern 221 includes a plurality of first marks 221a and a plurality of first spaces 221b between the first marks 221a. The first pattern 221 is formed on the interlayer insulation layer 213. The first antireflection film 228 covers the first marks 221a of the first pattern 221. The first interlayer insulation film 222 covers the first pattern 221 and the first antireflection film 228, and fills the first spaces 221b. The first pattern 221 is formed by etching one of layers of the IC chip 20. The first marks 221a are non-transparent. The first antireflection film 228 may be made of titanium nitride (TiN), for example. In the embodiment, the first antireflection film 228 only covers the first marks 221a of the first pattern 221. The first pattern 221 is a dot pattern. In alternative embodiments, the first pattern 221 may be a grid pattern, or a spiral pattern, for example.

The second pattern structure 212 includes a second pattern 223 and a second interlayer insulation film 224. The second pattern 223 is formed on the first interlayer insulation film 222. The second interlayer insulation film 224 is formed on the second pattern 223 and the first interlayer insulation film 222. The second pattern 223 is a non-transparent cross-shaped pattern and formed by etching one of the layers of the IC chip 20. The first pattern 221 and the second pattern 223 are formed by etching different two layers of the IC chip 20. The second pattern 223 is not limited to the cross-shaped pattern, but may be any shape (alignable shape) that corresponds to a shape of the alignment mark 112 on the first transparent substrate 101. The second pattern 223 is surrounded by the first marks 221a, as viewed from the photodetector 90. Directly facing the second pattern 223, no first marks 221 are formed on the interlayer insulation layer 213.

A region where the second pattern 223 is positioned is defined as a first region A1, and other region of the predetermined area A except the first region A1 is defined as a second region A2. The first region A1 appears a bright area, and the second region A2 appears a dark area. Because the first pattern 221 and the second pattern 223 are positioned in two different layers of the IC chip 20, and a distance of the second pattern 223 to the semiconductor substrate 201 is greater than a distance of the first pattern 223 to the semiconductor substrate 201, the incident light reflected by the first marks 221a through the first antireflection film 228 to the photodetector 90 in an incident direction is absorbed and scattered by the second pattern structure 212. Correspondingly, the incident light emitted from the second region A2 to the photodetector 90 is reduced, compared with the incident light from the first region A1 to the photodetector 90. That is, a luminance difference between the first region A1 and the second region A1 is increased. Accordingly, a contrast ratio of the alignment mark 202 is improved. Therefore, position and shape of the alignment mark 202 is accurately detected when the IC chip 20 and the first transparent substrate 101 are aligned and bonded.

Referring to FIG. 1 again, when the IC chip 20 is bonded to the liquid crystal panel 10, the alignment marks 112 and the alignment marks 202 are detected from a side of the first transparent substrate 101, that is, the Y direction, using the photodetector 90. When the alignment marks 112 are aligned with the respectively corresponding alignment marks 202, the IC chip 20 is bonded to the liquid crystal panel 10 by a machine (not shown).

Figure 5:
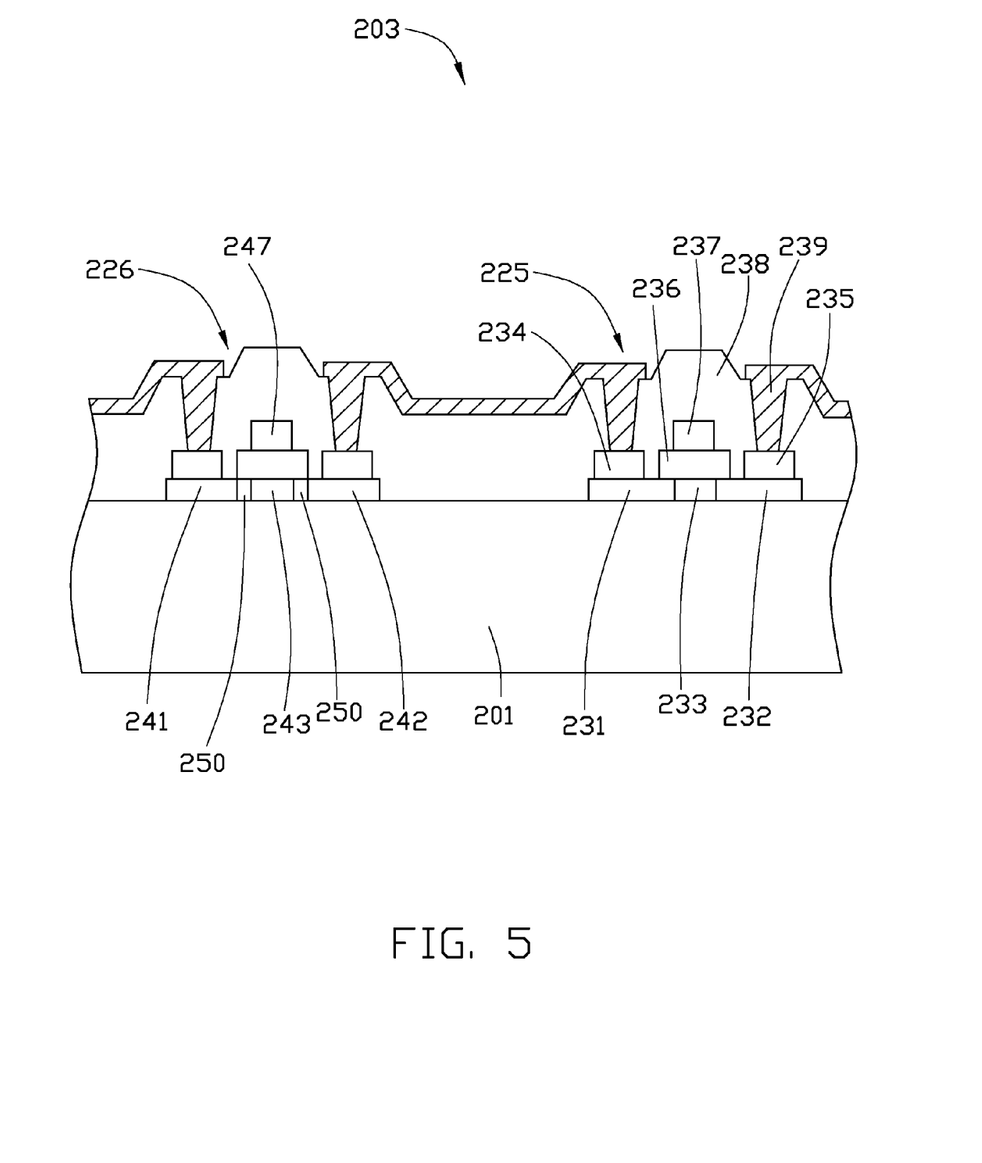
FIG. 5 is a sectional view showing a structure of the circuit area of FIG. 2 according to the present disclosure, as viewed from a photodetector side.
Figure 6:
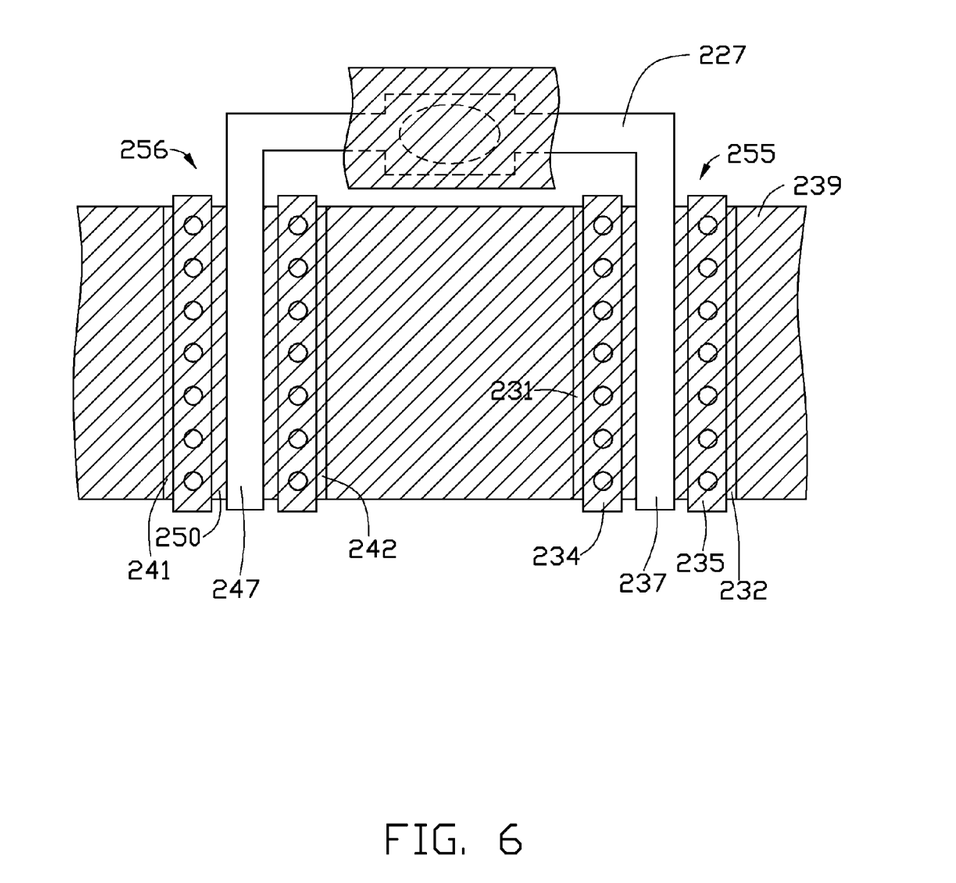
FIG. 6 is a plan view showing a structure of the circuit area of FIG. 2 according to the present disclosure, as viewed from a photodetector side.

Referring to FIGS. 5 and 6, a structure of the circuit area 203 is described. FIG. 5 is a sectional view showing the structure of the circuit area 203 of FIG. 2 according to the present disclosure, as viewed from the photodetector 90. FIG. 6 is a plan view showing the structure of the circuit area 203 of FIG. 2 according to the present disclosure, as viewed from the photodetector 90. The IC chip 20 includes the circuit components such as a transistor 225 and a transistor 226 (shown in FIG. 5), and a plurality of non-transparent metal wirings 227 positioned on at least one layer of the circuit area 203. The non-transparent metal wirings 227 are connected to the circuit components. In the embodiment, the transistor 225 is a p-channel metal oxide semiconductor (PMOS), the transistor 226 is a n-channel metal oxide semiconductor (NMOS), and the number of the at least one metal wiring layer is one.

The transistor 225 includes a source doped area 231, a drain doped area 232, a polysilicon layer 233 positioned between the source doped area 231 and the drain doped area 232, a source electrode 234 positioned on the source doped area 231, a drain electrode 235 positioned on the drain doped area 232, a gate insulating layer 236 positioned on the polysilicon layer 233 and partially overlapped with the source doped area 231 and the drain doped area 232, a gate electrode 237 positioned on the gate insulating layer 236, an interlayer insulation layer 238 positioned on the gate electrode 237, the gate insulating layer 236, the source doped area 231, the drain doped area 232, the source electrode 234 and the drain electrode 235, and two transparent conductive layers 239. The interlayer insulation layer 238 has two contact holes (not labeled) respectively penetrating the interlayer insulation layer 238. One of the two transparent conductive layer 239 is connected to the source electrode 234 via one of the two contact holes, and the other one of the two transparent conductive layer 239 is connected to the drain electrode 235 via the other one of the two contact holes.

Differences between the transistor 236 and the transistor 235 include: first, ions doped in a source doped area 241 and a drain doped area 242 of the transistor 226 differ from irons in the source doped area 231 and the drain doped area 232 of the transistor 225; second, the transistor 226 further includes two lightly doped drain area 250, with one of the two lightly doped drain area 250 positioned between the source doped area 241 and a polysilicon layer 243, and the other one positioned between the drain doped area 242 and the polysilicon layer 243. One of the non-transparent metal wirings 227 connects the gate electrode 237 of the transistor 225 to a gate electrode 247 of the transistor 226. The source doped area 231, the drain doped area 232, the source doped area 241, the drain doped area 242, the lightly doped drain areas 250, the polysilicon layer 233, the polysilicon layer 243, the source electrode 234, the drain electrode 235, the gate electrode 237, and the gate electrode 247 are all non-transparent.

During a manufacturing process of forming the IC chip 20, the first pattern 221 and the second pattern 223 are formed by utilizing non-transparent objects positioned in different two layers of the circuit area 203, as long as the first pattern 221 are positioned between the second pattern 223 and the semiconductor substrate 201, so that the first pattern 221 can be formed simultaneously with the formation of one of the non-transparent objects in the circuit area 203, and the second pattern 223 can be formed simultaneously with the formation of another one of the non-transparent objects in the circuit area 203.

As the above described, the contrast ratio of the alignment mark 202 is improved. Therefore, the position and shape of the alignment mark 202 is accurately detected when the IC chip 20 and the first transparent substrate 101 are aligned and bonded.

Figure 7:
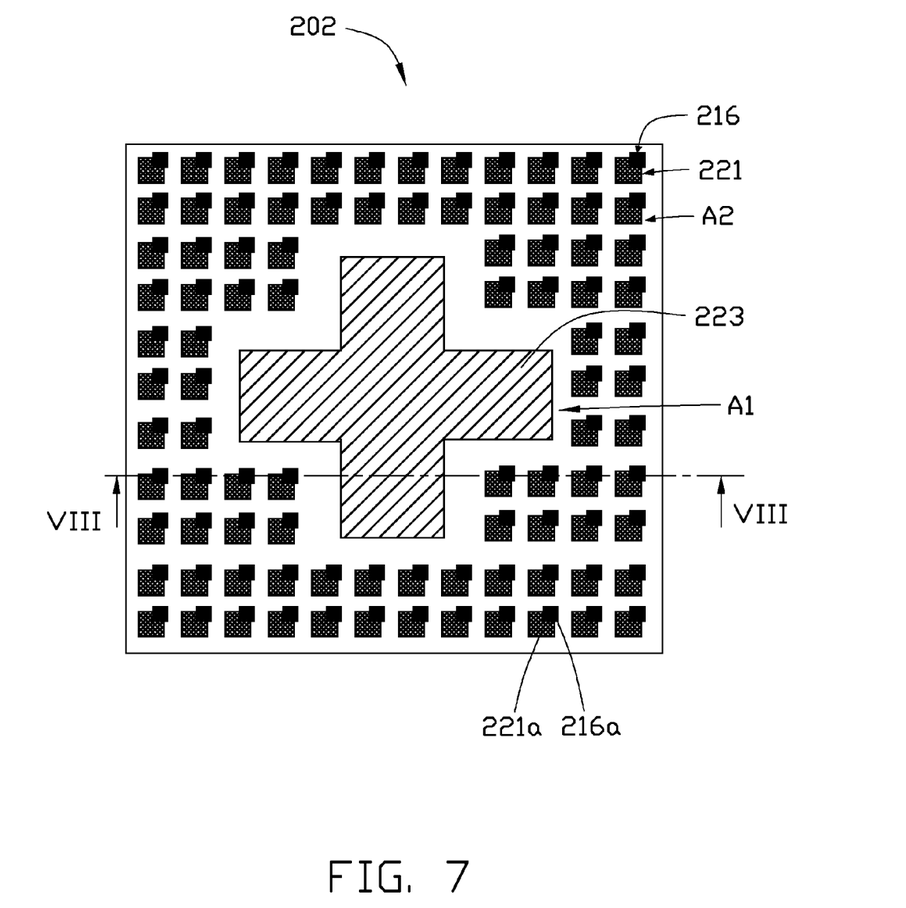
FIG. 7 is a plan view showing a structure of the alignment mark of FIG. 2 in a second embodiment according to the present disclosure, as viewed from the photodetector side.
Figure 8:
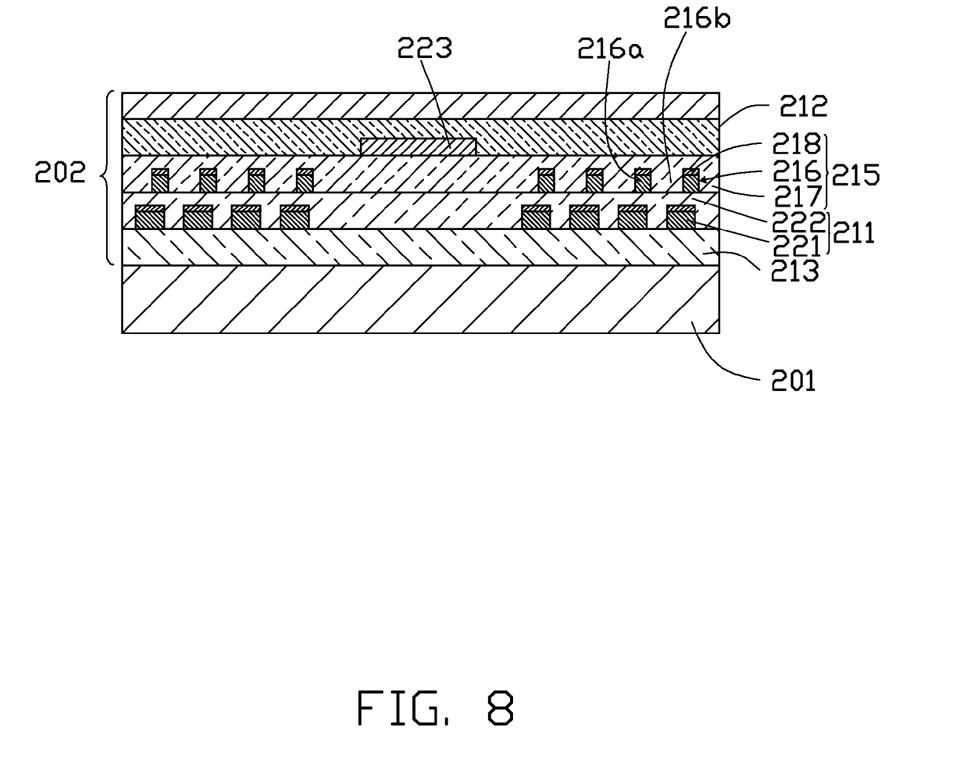
FIG. 8 is a sectional view along the line VIII-VIII shown in FIG. 7.

Referring to FIGS. 7 and 8, a structure of one of the alignment marks 202 of FIG. 2 in a second embodiment is described. FIG. 7 is a plan view showing the structure of the alignment mark 202 of FIG. 2 in a second embodiment according to the present disclosure, as viewed from the photodetector 90. FIG. 8 is a sectional view along the line VIII-VIII shown in FIG. 7. In the alignment mark 202 of the first embodiment, the first pattern 221 provided in one of layers of the first pattern structure 211 forms the second region A2. However, the second region A2 of the alignment mark 202 may be formed by a plurality of patterns positioned in different layers of the IC chip 20. In the second embodiment, the second region A2 of the alignment mark 202 is formed by non-transparent patterns provided in each of the plurality of pattern structures (two pattern structures herein). The alignment mark 202 in the second embodiment has the structure further including a third pattern structure 215. In the embodiment, the third pattern structure 215 is positioned between the first pattern structure 211 and the second pattern structure 212. In alternative embodiments, the third pattern structure 215 may be positioned between the first pattern structure 211 and the interlayer insulation layer 213 on the semiconductor substrate 201.

The third pattern structure 215 includes a third pattern 216, a second antireflection film 218, and a third interlayer insulation film 217. The third pattern 216 includes a plurality of second marks 216a and a plurality of second spaces 216b between the second marks 216a. The third pattern 216 is formed on the first interlayer insulation film 222. The second antireflection film 218 covers the second marks 216a of the third pattern 216. The third interlayer insulation film 217 covers the third pattern 216 and the second antireflection film 218, and fills the second spaces 216b. The first pattern 221, the second pattern 223, and the third pattern 216 are formed by etching different three layers of the of the IC chip 20. The second marks 216a are non-transparent. The second antireflection films 218 may be made of titanium nitride (TiN), for example. In the embodiment, the second antireflection film 218 only covers the second marks 216a of the third pattern 216. The third pattern 216 is a dot pattern. In alternative embodiments, the third pattern 216 may be a grid pattern, or a spiral pattern, for example.

Each of the first marks 221a partially overlaps with at least one second mark 216a. In the embodiment, a cross section of each of the first marks 221a and a cross section of each of the second marks 216a are both in a rectangular shape. An area of the cross section of each of second marks 216a is smaller than an area of the cross section of each of the first marks 221a. A corner of each of the first marks 221a partially overlaps with a corner of a separate second mark 216a. Because the second mark 216a further scatter the incident light from the photodetector 90, and a distance of the first pattern 221 to the second pattern structure 212 becomes greater, the contrast ratio of the first region A1 to the second region A2 is further increased.

The third pattern 216 can be formed simultaneously with the formation of one of the non-transparent objects in the circuit area 2, as long as the third pattern structure 215 is sandwiched between the first pattern structure 211 and the second pattern structure 212, or between the first pattern structure 211 and the semiconductor substrate 201.

Figure 9:
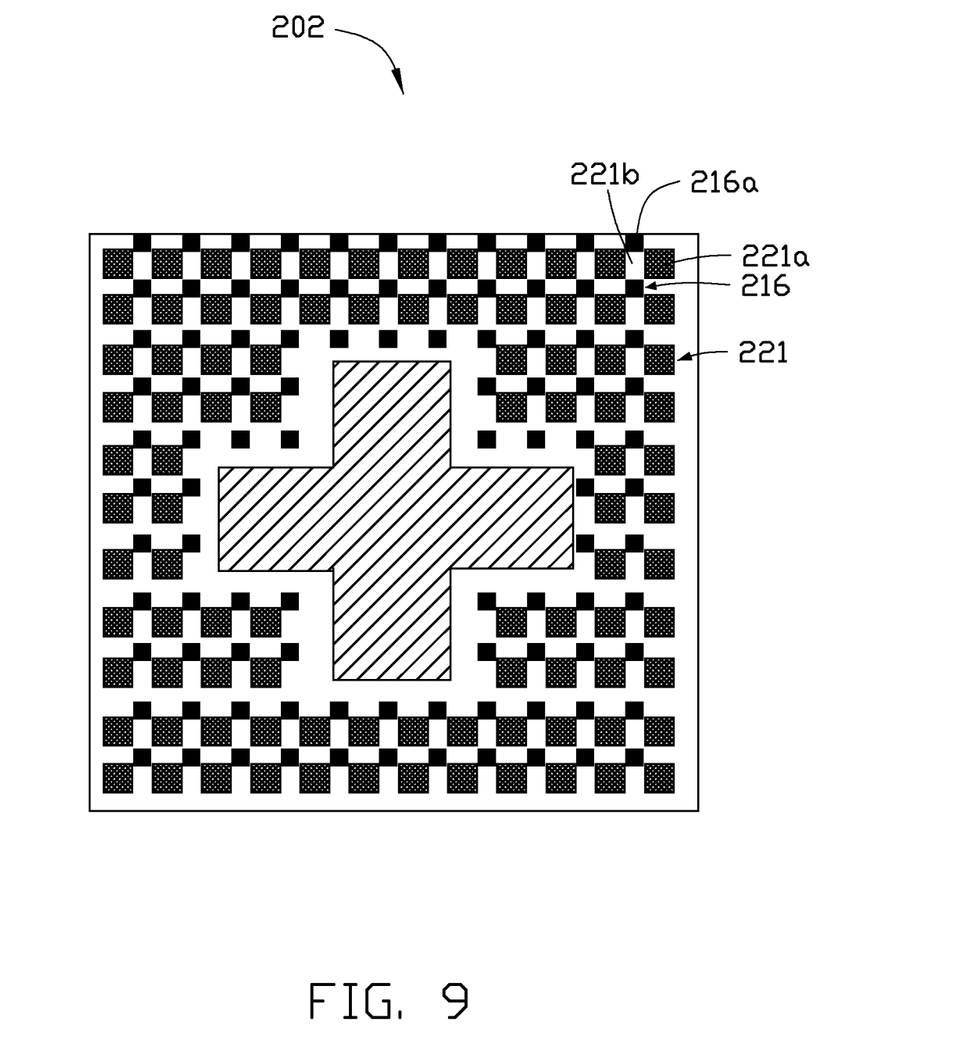
FIG. 9 is a plan view showing a structure of the alignment mark of FIG. 2 in a third embodiment according to the present disclosure, as viewed from the photodetector side.

Referring to FIG. 9, a structure of one of the alignment marks 202 of FIG. 2 in a third embodiment is described. FIG. 9 is a plan view showing the structure of the alignment mark 202 of FIG. 2 in a third embodiment according to the present disclosure, as viewed from the photodetector 90. The alignment mark 202 according in the third embodiment differs from the alignment mark 202 of the second embodiment in that the second marks 216a of the third pattern 216 do not overlap with the first marks 221a of the first pattern 221. The second marks 216a directly correspond to the first spaces 221b of the first pattern 221, as viewed from the photodetector 90.

Figure 10:
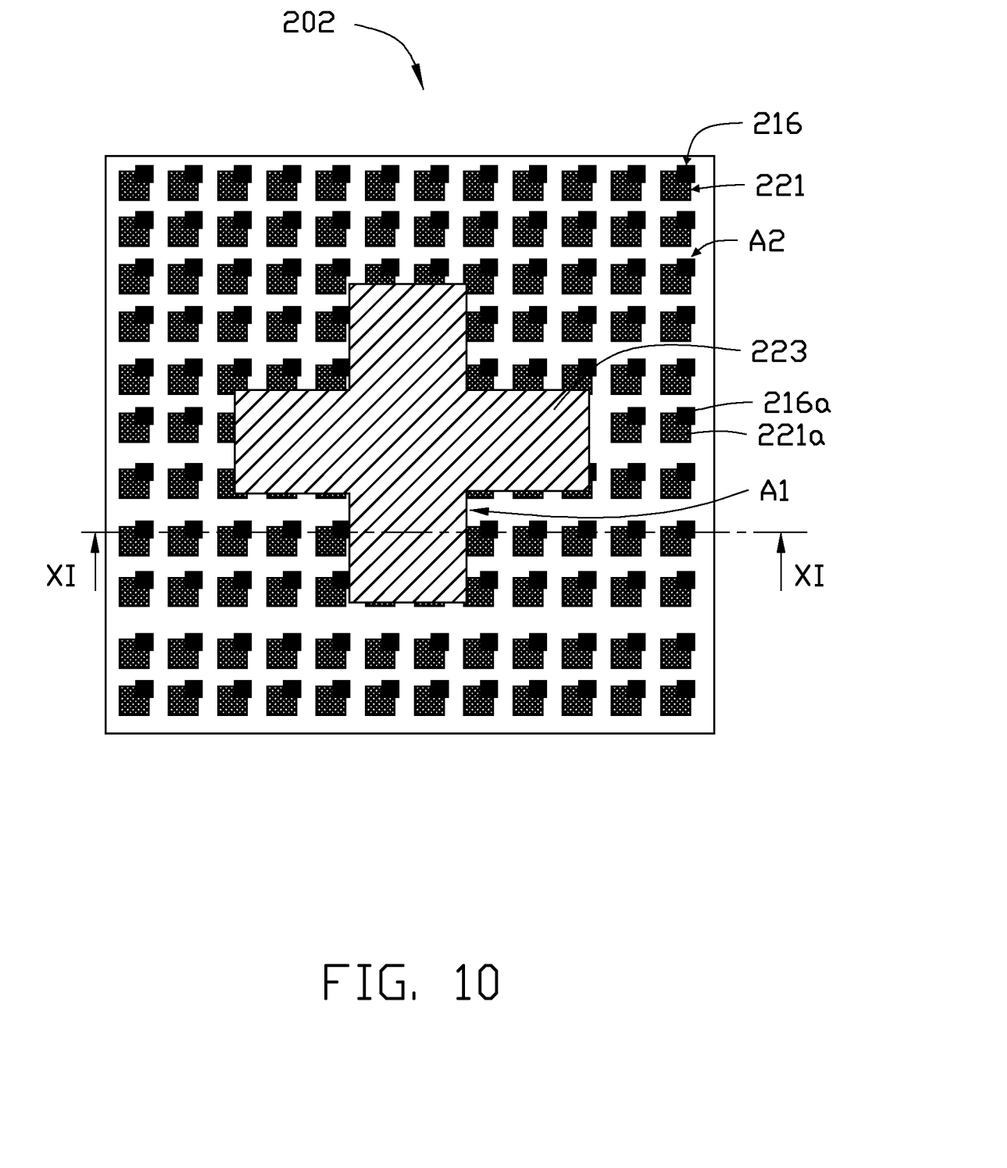
FIG. 10 is a plan view showing a structure of the alignment mark of FIG. 2 in a fourth embodiment according to the present disclosure, as viewed from the photodetector side.
Figure 11:
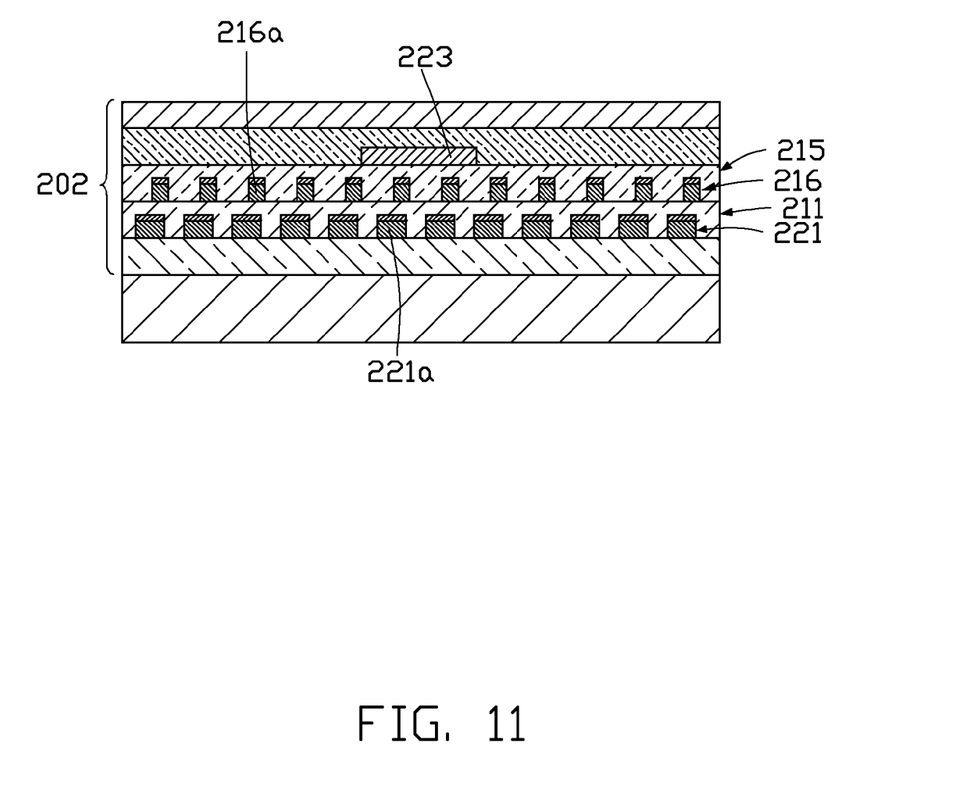
FIG. 11 is a sectional view along the line XI-XI shown in FIG. 10.

Referring to FIGS. 10 and 11, a structure of one of the alignment marks 202 of FIG. 2 in a fourth embodiment is described. FIG. 10 is a plan view showing the structure of the alignment mark 202 of FIG. 2 in a fourth embodiment according to the present disclosure, as viewed from the photodetector 90. FIG. 11 is a sectional view along the line XI-XI shown in FIG. 10. The alignment mark 202 in the fourth embodiment of the present disclosure differs from the alignment mark 202 of the second embodiment in that the first pattern 221 of the first pattern structure 211 not only includes a plurality of first marks 221a surrounding the second pattern 223, but also includes a plurality of first marks 221a directly facing the second pattern 223. In the embodiment, the first marks 221a are homogeneously (evenly) distributed in the first pattern 221.

Similarly to the first pattern structure 221, the third pattern structure 215 of the alignment mark 202 in the fourth embodiment not only includes a plurality of second marks 216a surrounding the second pattern 223, but also includes a plurality of second marks 216a directly facing the second pattern 223. In the embodiment, the second marks 216a are homogeneously (evenly) distributed in the third pattern structure 215. The second marks 216a partially overlap with the first marks 221a, respectively. In alternative embodiments, the second marks 216a do not overlap with the first marks 221a, respectively.

Although certain embodiments of the present disclosure have been specifically described, the present disclosure is not to be construed as being limited thereto. Various changes or modifications may be made to the present disclosure without departing from the scope and spirit of the present disclosure.

What is claimed is:

1. A semiconductor device, comprising:
a substrate; and
an alignment mark positioned on the substrate, the alignment mark comprising:
a first pattern structure stacked on the substrate and comprising a first pattern, the first pattern comprising a plurality of first marks that are non-transparent; and
a second pattern structure stacked on the first pattern structure and comprising a second pattern that is non-transparent and surrounded by the first marks in a plan view perspective; and wherein none of the plurality of first marks overlaps with the second pattern in the plan view perspective.

2. The semiconductor device according to claim 1, wherein a predetermined area at a peripheral region of the semiconductor device is designated to form the alignment mark, a luminance of the second pattern is higher than a luminance of the first pattern, so as to increase a contrast ratio of the second pattern to the first pattern.

3. The semiconductor device according to claim 2, further comprising a third pattern structure sandwiched between the substrate and the second pattern structure, wherein the third pattern structure is positioned on or under the first pattern structure, the third pattern structure comprises a third pattern, the third pattern comprises a plurality of second marks that are not non-transparent.

4. The semiconductor device according to claim 3, wherein the second marks surround the second pattern in the plan view perspective.

5. The semiconductor device according to claim 4, wherein the third pattern does not overlap with the second pattern.

6. The semiconductor device according to claim 4, wherein the third pattern not only comprises a plurality of second marks surrounding the second pattern in the plan view perspective, but also comprises a plurality of second marks overlapping with the second pattern.

7. The semiconductor device according to claim 4, wherein the first pattern and the third pattern are both a dot pattern.

8. The semiconductor device according to claim 2, wherein the first pattern structure further comprises a first antireflection film covering the first marks, along a stack direction of the first pattern structure to the substrate.

9. The semiconductor device according to claim 4, wherein the third pattern structure further comprises a second antireflection film covering the second marks, along a stack direction of the first pattern structure to the substrate.

10. The semiconductor device according to claim 4, wherein the first marks and the third marks are made of metal materials or semiconductor materials.

11. A display device, comprising:
a transparent substrate having a first alignment mark; and
a semiconductor device bond to the transparent substrate, the semiconductor device comprising:
a substrate; and
a second alignment mark positioned on the substrate, the second alignment mark comprising:
a first pattern structure stacked on the substrate and comprising a first pattern, the first pattern comprising a plurality of first marks that are non-transparent; and
a second pattern structure stacked on the first pattern structure and comprising a second pattern that is non-transparent and surrounded by the first marks in a plan view perspective;
wherein the second pattern is an alignable shape that corresponds to a shape of the first alignment mark on the transparent substrate; and none of the plurality of first marks overlaps with the second pattern in the plan view perspective.

12. The display device according to claim 11, wherein a predetermined area at a peripheral region of the semiconductor device is designated to form the second alignment mark, a luminance of the second pattern is higher than a luminance of the first pattern, so as to increase a contrast ratio of the second pattern to the first pattern.

13. The display device according to claim 12, wherein the first marks are homogeneously distributed in the first pattern.

14. The display device according to claim 13, wherein the second alignment mark further comprises a third pattern structure sandwiched between the substrate and the second pattern structure the third pattern structure is on or under the first pattern structure, and the third pattern structure comprises a plurality of second marks that are not non-transparent.

15. The display device according to claim 14, wherein the second marks surround the second pattern in the plan view perspective and partially overlap with the first marks respectively.

* * * * *